United States Patent [19]
Flynn et al.

[11] Patent Number: 5,391,233
[45] Date of Patent: Feb. 21, 1995

[54] APPARATUS FOR DEPOSITING HARD COATING IN A NOZZLE ORIFICE

[75] Inventors: Paul L. Flynn, Fairview; Anthony W. Giammarise, Erie, both of Pa.

[73] Assignee: General Electric Company, Erie, Pa.

[21] Appl. No.: 251,223

[22] Filed: May 31, 1994

Related U.S. Application Data

[62] Division of Ser. No. 965,659, Aug. 6, 1992, which is a division of Ser. No. 675,395, Mar. 26, 1991, abandoned, which is a division of Ser. No. 501,443, Mar. 30, 1990, abandoned.

[51] Int. Cl.$^6$ ............................................. C23C 16/00
[52] U.S. Cl. .................................... 118/725; 118/715; 118/723 HC
[58] Field of Search ................. 118/715, 725, 723 HC

[56] References Cited

U.S. PATENT DOCUMENTS

| | | | |
|---|---|---|---|
| 57,271 | 8/1866 | Adams, Jr. | 239/DIG. 19 |
| 1,940,171 | 12/1933 | Huss | 239/DIG. 19 |
| 4,427,720 | 1/1984 | Gauje | 427/237 |
| 4,592,506 | 6/1986 | Capes et al. | 239/139 |
| 4,816,286 | 3/1989 | Hirose | 427/255.1 |
| 4,960,643 | 10/1990 | Lemelson | 428/361 |
| 5,061,513 | 10/1991 | Flynn et al. | 427/318 |

FOREIGN PATENT DOCUMENTS

| | | |
|---|---|---|
| 58-55605 | 4/1983 | Japan . |
| 63-104671 | 5/1988 | Japan . |
| 427762A | 1/1992 | Japan . |
| 4103871 | 4/1992 | Japan . |

*Primary Examiner*—Richard Bueker
*Attorney, Agent, or Firm*—Ann M. Kratz; Marvin Snyder

[57] ABSTRACT

The present invention is directed to a process for coating the interior surfaces of an orifice in a substrate that forms a slurry fuel injection nozzle. In a specific embodiment, the nozzle is part of a fuel injection system for metering a coal-water slurry into a large, medium-speed, multi-cylinder diesel engine. In order to retard erosion of the orifice, the substrate is placed in a chemical vapor deposition (CVD) reaction chamber. A reaction gas is passed into the chamber at a gas temperature below its reaction temperature and is directed through the orifice in the substrate. The gas reaction temperature is a temperature at and above which the reaction gas deposits as a coating, and the reaction gas is of a composition whereby improved resistance to erosion by flow of the particulates in the slurry fuel is imparted by the deposited coating. Only the portion of the substrate in proximity to the orifice to be coated is selectively heated to at least the gas reaction temperature for effecting coating of the orifice's interior surfaces by the vapor deposited coating formed from the reaction gas.

6 Claims, 1 Drawing Sheet

APPARATUS FOR DEPOSITING HARD COATING IN A NOZZLE ORIFICE

The Government of the United States of America has rights in this invention pursuant to Contract No. DE-AC21-88MC23174 awarded by the U.S. Department of Energy.

This application is a division of application Ser. No. 07/965,395, filed Aug. 6, 1992, which is a division of Ser. No. 07/675,395, filed Mar. 26, 1991, now abandoned, which is a division of Ser. No. 07/501,443, filed Mar. 30, 1990, issued on Oct. 29, 1991, as U.S. Pat. No. 5,061,513.

BACKGROUND OF THE INVENTION

The present invention relates to nozzles through which a flow of particles passes and more particularly to improving the durability thereof.

Internal combustion engines designed to achieve a useful power output through the controlled combustion of solid powdered fuels, such as coal, have been proposed essentially since the early investigations of Rudolph Diesel. Generally, the difficulties encountered by investigators in connection with these engines have centered about the development of techniques for forming and controlling a particulate fuel-air mixture for introduction in properly timed fashion into a combustion chamber.

In one engine design approach, a mixture of powered coal and air is conveyed to an intake manifold, pre-combustion chamber, or the like, whereupon the mixture is directed to a combustion region for admission. The maintenance of the particulate suspension during this procedure is difficult, resulting in unwanted powder accumulation and degradation of desired fuel-air ratios. Approaches intended to maintain a proper particulate suspension have included, for example, "animators" serving to agitate particles within the mixture as it awaits introduction to a region of combustion. Loss of consistency in a predetermined and desired suspension necessarily results in a loss of accurate metering of fuel into the combustion chamber leading to vagaries in cylinder power output. The coal/air mixture is pumped into the combustion chamber under pressure, thus creating nozzle erosion problems, particularly with the orifice of the nozzle that injects the mixture in the combustion chamber.

In another typical engine design approach, a mixture of coal and water (hereinafter sometimes referred to as CWM") is injected into a compression ignition reciprocating internal combustion engine such as a large, medium-speed, multi-cylinder diesel engine. In such a mixture, there are fine particles of coal which similarly can cause excessive rates of wear and premature failure of components in the fuel injection system. CWM fuel includes, for example, from less than 30 wt-% to as much as 60 wt-% coal particles in the range of from 0.01 to 50 microns in diameter. These particles are both abrasive and corrosive to the materials used in the nozzles and other components of the fuel injection system.

Regardless of the form of the fuel mixture, rapid wear of the fuel injection nozzle due to erosion is a universal problem. Solutions thereto, particularly with respect to CWM fuel, have included the insertion of a bushing or liner of very hard material in the nozzle of the fuel injector. These liners have been manufactured from silicon carbide, cubic boron nitride, tungsten carbide, polycrystalline diamond compacts, and alumina (sapphire). While some of these materials appear as appropriate candidates for CWM nozzle orifice applications, such liners undersirably affect the flow, atomization and strength characteristics that are required for proper operation of the fuel injection system.

BROAD STATEMENT OF THE INVENTION

The present invention is directed to a practical process for depositing a thin coating of superhard material on the interior surfaces of an orifice in a fuel injection nozzle, which orifice comprises at least one small aperture penetrating through a substrate of relatively strong, ductile material. In a specific embodiment, the nozzle is part of a fuel injection system for metering CWM fuel into a large, medium-speed, multi-cylinder diesel engine. In order to retard erosion of the orifice, the substrate in which the orifice is disposed is placed in a chemical vapor deposition (CVD) reaction chamber. A reaction gas is passed into the chamber at a gas temperature below its reaction temperature. The gas reaction temperature is a temperature at and above which the reaction gas deposits as a coating, and the reaction gas is of a composition whereby improved resistance to erosion by flow of the particulates in the CWM fuel is imparted by the deposited coating. The reaction gas is directed through the orifice to be coated, and the portion of the substrate in proximity to the orifice is selectively heated to at least the gas reaction temperature for effecting the desired deposition, on the interior surfaces of the orifice, of a vapor deposited coating formed from the reaction gas.

Advantageously, the nozzle orifice additionally comprises a fuel sac disposed between a larger cavity in the substrate and a ring of two or more apertures. In order to promote the selective deposition of the coating onto the interior surfaces of such an orifice, it may be desirable to cool some portions of the substrate, especially those upon which no vapor deposited coating is desired.

Advantages of the present invention include the ability to selectively coat nozzle orifices with a vapor deposited coating. Another advantage is the ability to coat nozzle orifices with a wear layer that does not significantly alter the performance of the nozzle. A further advantage is the ability to control the thickness and uniformity of the coating on the nozzle orifice by control of reaction conditions. These and other advantages will be readily apparent to those skilled in the art based upon the disclosure contained herein.

Figure 1:
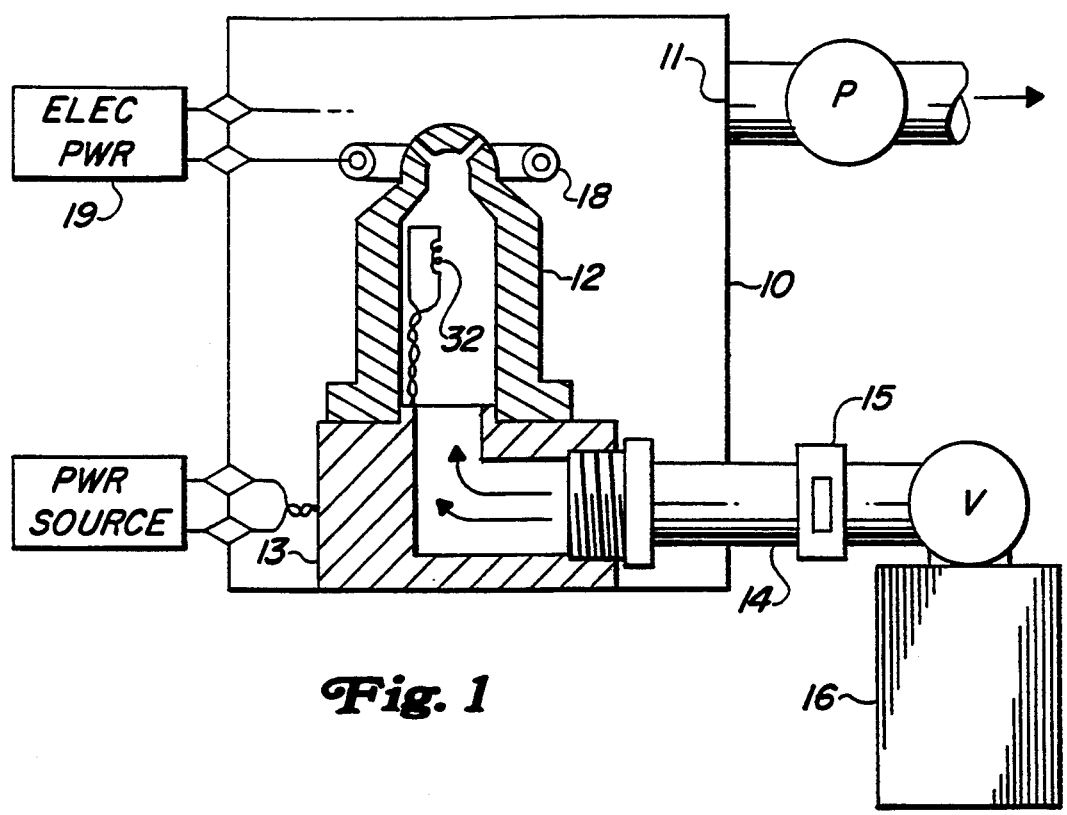
FIG. 1 is a schematic diagram depicting how the invention can be implemented to selectively coat a nozzle orifice.

The drawing will be described in detail below.

DETAILED DESCRIPTION OF THE INVENTION

An archetypal fuel injection system which can suffer from undesirable wear due to the particulate fuel passed through the nozzle orifice is disclosed in commonly-assigned U.S. Pat. No. 4,782,794—Hsu and Leonard. Very high injection pressures (e.g. on the order of 10,000–15,000 psi) are required to cause sufficient atomization of the CWM so that this fuel will mix adequately with air in a combustion chamber for ignition and complete burn-out in the time available (e.g. 10–12 milliseconds in an engine running at 1,000 rpm), and such high injection pressures need to be sustained to ensure good combustion at reduced loads/speed. It is not surprising, then, that prior art injector nozzles suffer from premature failure due to erosion resulting from the particulate fuel pumped through the injector at these very high pressures.

Implementation of conventional CVD technology would result in the vapor deposition of a non-uniform coating on all exposed surfaces of the substrate disposed in the CVD reaction chamber. Since it is not desirable to coat the entire fuel injector part, a modified CVD process is called for. As is illustrated at FIG. 1, CVD reaction chamber 10 normally is held under vacuum by a conventional vacuum pump P connected to the outlet 11 of the chamber, though some CVD processing at atmospheric or superatsmospheric pressure has been proposed in the art. An annular, hollow substrate 12 which suitably can be the nozzle for a fuel injector is disposed within CVD reaction chamber 10. This substrate is made of strong, ductile material such as stainless steel. Only the interior surfaces of the ventral fuel sac and spray holes in the distal end of the nozzle 12 are desired to be coated with a thin layer of superhard material.

The substrate 12 is supported in an inverted position by a multi-outlet manifold 13 inside the CVD reaction chamber 10, the main cavity of the substrate registering with one of the cylindrical outlets of this manifold. Additional substrates (not shown) can be similarly disposed on other outlets of the same manifold. The coating process involves passing unheated reaction gas into chamber 10 via a line 14 connected through a flow meter 15 and a control valve V to a pressurized tank 16 of such gas. Inside chamber 10 the manifold 13 directs the relatively cool reaction gas from the line 14 to the cavity of substrate 12.

Selective heating of only the distal end of substrate 12, i.e., the portion of the substrate in closest proximity to the fuel sac and spray holes, is accomplished by means of an electrical heating element 18 which preferably is an induction heating coil surrounding this end and energized by alternating current from a suitably controlled source 19 of electrical power so as to heat the distal end of substrate 12 to the reaction gas reaction temperature. The "reaction temperature" for present purposes is that temperature whereat the reaction gas deposits as a coating. Alternatively, the heating element 18 could be a hot tungsten filament. After an appropriate period of time has elapsed, a coating of desired thickness will adhere to the heated interior surfaces of the passages through which the gas leaves the hollow substrate 12, and the valve V is turned off. Before removing the substrate from the chamber 10, it is desirable to provide post heating and controlled cooling intervals to improve the bond and to avoid high stresses at the interface of the superhard coating and the substrate.

Figure 2:
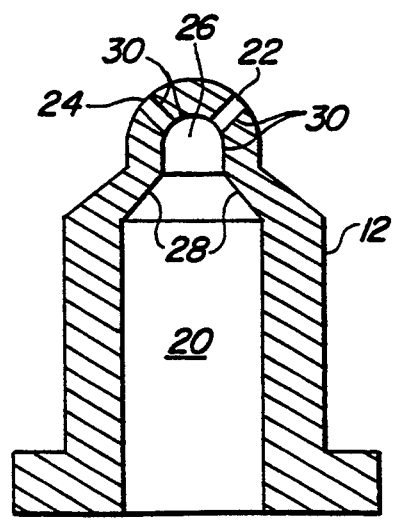
FIG. 2 is an enlarged cross-sectional view of the simplified fuel injection nozzle showing where the coating is deposited by the process represented at FIG. 1.

With particular reference to FIG. 2, it will be observed that the substrate 12 has a relatively large, uncoated cylindrical cavity 20 which is in communication with a coated orifice comprising a fuel sac 26 of reduced diameter and a ring of smaller apertures or spray holes in the distal end of substrate 12. Two such apertures 22 and 24 are shown in FIG. 2; in practice the number of apertures may range from one to ten or more. In an assembled injector, the conical tip of a reciprocally moveable needle (not shown) will be seated concentrically in a correspondingly shaped valve seat 28 around the open end of the fuel sac 26. Because the orifice (i.e., the apertures 22 and 24 and the fuel sac 26 with which they communicate) presents a substantial constriction on the flow of reaction gas during the CVD coating process represented at FIG. 1, the process yields an improved result. This geometry results in the concentration of the reaction gas increasing as it flows from cavity 20 past valve seat 28 through sac 26 and thence into apertures 22 and 24. Moreover, the velocity of the reaction gas also increases in these constricted passages. Coupled with the localized heating of the substrate, the increased gas concentration and flow rate result in the preferential coating of the interior surfaces of the fuel sac 26 and of apertures 22 and 24 as indicated by reference number 30 in FIG. 2. A more uniform coating is also obtained by virtue of the higher gas velocity resulting from the nozzle geometry. Accordingly, a highly selective coating process results.

A variety of superhard coatings can be formed in accordance with known CVD technology. These coatings generally are ceramics such as carbides, nitrides, and borides. Specific coatings include, for example, silicon carbide, tantalum carbide, tungsten carbide, boron nitride, titanium diboride, and mixtures thereof. The flow rate is appropriately controlled so that the gas passes through the nozzle orifice with a velocity in a range between about one meter per hour and about one meter per second. The surfaces to be coated are heated to a temperature (e.g., 1,500° F.) that is optimum for effecting the desired deposition of the reaction gas. Coating thicknesses preferably will range from about ten to 1,000 microns, depending upon the concentration of the reaction gas, the reaction temperature, and importantly on the reaction time. Less than ten microns may be suitable for some nozzle applications. CVD diamond coatings for injector nozzles can be applied in accordance with commonly-assigned patent application Ser. No. 07/464,818 filed on Jan. 16, 1990.

By following the above-described steps, satisfactory coatings can be deposited using many different reaction gases. If, however, the desired coatings were not obtained, yet another step should be added to the process. The additional, optional step is to ionize and decompose the reaction gas so that its atoms are disassociated from the molecular structure of the gas and will readily adhere to the heated interior surfaces of the nozzle orifice. This ionizing-disassociation step is performed before the gas enters the nozzle orifice (e.g., in or near the manifold 13) be either of two techniques: pre-heating the reaction gas to its decomposition temperature (which may be much higher than its optimum deposition temperature), or exciting the reaction gas with electromagnetic radiation (e.g., either radio frequency radiation or microwaves) to form a plasma. The preheating step could be implemented, for example, by a hot tungsten filament in the manifold 13, in which case the manifold needs to be thermally insulated from the substrate 12, or in the cavity 20 of the substrate itself, as is indicated at reference No. 32 in FIG. 1. The alternative exciting step could be implemented, for example, by connecting a radio frequency or microwave source across two electrodes disposed on opposite sides of the flow path of the reaction gas upstream from the substrate 12.

Nozzles coated in accordance with the precepts of the present invention are useful in a particulate fuel injection system, such as disclosed in U.S. Pat. No. 4,782,794. Such fuel preferably comprises a mixture of water and bituminous coal (approximately 50 wt-% each), the coal being beneficiated by a physical process that reduces it to very small particles (e.g. with a mean particle size in the range of 3–5 microns in diameter). The CWM fuel needs to have a low enough viscosity to flow freely through holes of approximately 0.5 mm (0.02 in) diameter for apertures 22 and 24 of the nozzle. In this regard, it will be appreciated that the present invention permits thin coatings to be applied to the erodible areas in such a manner as to not interfere significantly with the atomization of liquid flow therethrough and not placing undue stresses on the coated nozzle.

Numerous modifications, variations, substitutions, and equivalents to the invention as illustrated herein will probably occur to those skilled in the art based upon the disclosure contained herein. Accordingly, it is intended by the appended claims to cover all such changes and modifications as fall within the precepts and scope of the present invention. All citations referred to herein are expressly incorporated herein by reference.

We claim:

1. An apparatus for selectively applying an interior coating to a fuel injection nozzle having at least one aperture operatively positioned therein, the apparatus comprising:
 a chamber;
 means for introducing unheated reaction gas into the chamber;
 means for controlling the flow of the reaction gas into the chamber;
 means for directing the reaction gas from the gas introduction means into the fuel injection nozzle; and
 means for heating a selected portion of the fuel injection nozzle proximate the aperture, the nozzle being positioned in the chamber so that the concentration and velocity of the reaction gas increases as the gas flows through the nozzle and out the aperture.

2. An apparatus for selectively coating the interior surface of the fuel injection nozzle having at least one aperture operatively positioned therein, the apparatus comprising:
 means for positioning the fuel injection nozzle in a chemical vapor deposition reaction chamber;
 means for introducing a reaction gas into the chamber at a temperature lower than its reaction temperature;
 means for heating that portion of the nozzle selected to have the coating deposited thereon to a temperature sufficient to cause the reaction gas to interact with the interior surfaces of the heated portion of the nozzle; and
 means for directing a sufficient amount of the reaction gas to and through that portion of the nozzle where the coating is to be selectively deposited so that at least the interior surfaces of the aperture is sufficiently coated by the coating such that the rate of wear and premature failure of the fuel injection system due to abrasive and erosive materials contained in the fuel utilized in the system is reduced.

3. The apparatus of claim 2, wherein the nozzle is positioned in the chamber so that the concentration and velocity of the reaction gas increases as the gas flows through the nozzle and out the aperture.

4. The apparatus of claim 2, further including means for ionizing the reaction gas before the reaction gas enters the nozzle.

5. The apparatus of claim 2, further including means for cooling portions of the nozzle where no vapor deposited coating is desired at the same time that the means for heating heats that portion of the nozzle selected to have the coating deposited thereon.

6. The apparatus of claim 2, further including means for providing heating and cooling intervals, after the interior surface of the fuel injection nozzle has been selectively coated, to improve the bond and to avoid high stresses at the interface of the coating and the nozzle.

* * * * *